(12) United States Patent
Choi

(10) Patent No.: US 12,519,025 B2
(45) Date of Patent: Jan. 6, 2026

(54) PACKAGE SUBSTRATE AND SEMICONDUCTOR PACKAGE INCLUDING THE SAME

(71) Applicant: Samsung Electronics Co., Ltd., Suwon-si (KR)

(72) Inventor: Beoungjun Choi, Sejong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 620 days.

(21) Appl. No.: 17/936,937

(22) Filed: Sep. 30, 2022

(65) Prior Publication Data

US 2023/0146035 A1 May 11, 2023

(30) Foreign Application Priority Data

Oct. 5, 2021 (KR) .................. 10-2021-0131674

(51) Int. Cl.
*H01L 23/31* (2006.01)
*H01L 23/00* (2006.01)
(Continued)

(52) U.S. Cl.
CPC ...... *H01L 23/3135* (2013.01); *H01L 23/3677* (2013.01); *H01L 23/49816* (2013.01); *H01L 23/49822* (2013.01); *H01L 23/49838* (2013.01); *H01L 23/49894* (2013.01); *H01L 24/32* (2013.01); *H01L 24/48* (2013.01); *H01L 24/73* (2013.01); *H01L 25/0657* (2013.01); *H01L 2224/32145* (2013.01); *H01L 2224/32225* (2013.01); *H01L 2224/48091* (2013.01); *H01L 2224/48147* (2013.01); *H01L 2224/48228* (2013.01); *H01L 2224/73215* (2013.01);
(Continued)

(58) Field of Classification Search
CPC ............ H01L 23/3135; H01L 23/3677; H01L 23/49816; H01L 23/49822; H01L 23/49838; H01L 23/49894; H01L 24/32; H01L 24/48; H01L 24/73; H10B 80/00
USPC ..................................................... 257/690
See application file for complete search history.

(56) References Cited

U.S. PATENT DOCUMENTS 8,956,914 B2  2/2015  Yun et al.
9,412,720 B2  8/2016  Nam et al.
(Continued)

*Primary Examiner* — Jasmine J Clark
(74) *Attorney, Agent, or Firm* — Wolf, Greenfield & Sacks, P.C.

(57) ABSTRACT

A package substrate and a semiconductor package including the same are provided. The semiconductor package includes a package substrate including a base having a front side and a back side, rear pads below the back side of the base, lower connection patterns below the rear pads and in contact with the rear pads, first and second front pads on the front side of the base, a first support pattern on the front side of the base having a thickness greater than a thickness of each of the first and second front pads, and a protective insulating layer on the front side of the base and having openings exposing the first and second front pads respectively, and on an upper surface and a side surface of the first support pattern; a lower semiconductor chip on the protective insulating layer of the package substrate, spaced apart from the first support pattern in a horizontal direction; and a first upper semiconductor chip on the package substrate vertically overlapping the lower semiconductor chip and the first support pattern.

20 Claims, 16 Drawing Sheets

(51) Int. Cl.
*H01L 23/367* (2006.01)
*H01L 23/498* (2006.01)
*H01L 25/065* (2023.01)

(52) U.S. Cl.
CPC ............... *H01L 2224/73265* (2013.01); *H01L 2225/06506* (2013.01); *H01L 2225/0651* (2013.01); *H01L 2225/06524* (2013.01); *H01L 2225/06548* (2013.01); *H01L 2225/06562* (2013.01); *H01L 2225/06589* (2013.01); *H01L 2924/1436* (2013.01); *H01L 2924/1438* (2013.01)

(56) References Cited

U.S. PATENT DOCUMENTS

| | | | |
|---|---|---|---|
| 11,721,671 B2 * | 8/2023 | Park | H01L 23/31 257/773 |
| 2010/0140779 A1 | 6/2010 | Lin et al. | |
| 2011/0163444 A1 | 7/2011 | Hayashi | |
| 2014/0167291 A1 | 6/2014 | Nam et al. | |
| 2016/0322317 A1 | 11/2016 | Paek et al. | |
| 2020/0395340 A1 | 12/2020 | Lee | |
| 2022/0122957 A1 * | 4/2022 | Miura | H01L 24/16 |

\* cited by examiner

PACKAGE SUBSTRATE AND SEMICONDUCTOR PACKAGE INCLUDING THE SAME

CROSS-REFERENCE TO RELATED APPLICATION(S)

This application claims the benefit below 35 USC 119(a) of Korean Patent Application No. 10-2021-0131674 filed on Oct. 5, 2021 in the Korean Intellectual Property Office, the entire disclosure of which is incorporated herein by reference for all purposes.

BACKGROUND

The present inventive concept relates to a package substrate, a semiconductor package including the same, and a method of forming the same.

According to weight reduction and the implementation of high performance in electronic devices, miniaturization and high performance are required in the semiconductor package field as well. In order to implement miniaturization, weight reductions, high performance, high capacity, and high reliability of the semiconductor package, research into and development of mounting a plurality of semiconductor chips in a single semiconductor package are being continuously conducted.

SUMMARY

Example embodiments provide a package substrate on which a plurality of semiconductor chips may be mounted.

Example embodiments provide a semiconductor package including a plurality of semiconductor chips.

According to example embodiments, a semiconductor package includes a package substrate including a base having a front side and an opposing back side, rear pads below the back side of the base, lower connection patterns below the rear pads and in contact with the rear pads, first and second front pads on the front side of the base, a first support pattern on the front side of the base having a thickness greater than a thickness of each of the first and second front pads, and a protective insulating layer on the front side of the base and having openings exposing the first and second front pads respectively, and on an upper surface and a side surface of the first support pattern; a lower semiconductor chip on the package substrate, spaced apart from the first support pattern in a horizontal direction parallel to the front side of the base, and on the protective insulating layer; and a first upper semiconductor chip vertically overlapping the lower semiconductor chip and the first support pattern, on the package substrate.

According to example embodiments, a semiconductor package includes a package substrate including a base having a front side and an opposing back side, front pads on the front side of the base, a support pattern having a thickness greater than a thickness of each of the front pads, on the front side of the base, and a protective insulating layer having openings exposing the front pads, respectively, on the front side of the base, and in contact with at least a portion of the support pattern; a lower semiconductor chip on the protective insulating layer and spaced apart from the support pattern in a horizontal direction; and a first upper semiconductor chip vertically overlapping the lower semiconductor chip and the support pattern, on the protective insulating layer and the lower semiconductor chip. The support pattern includes a metal post, and a lower surface of the support pattern is on a level lower than upper surfaces of the front pads.

According to example embodiments, a package substrate includes a base having a front side and an opposing back side; rear pads below the back side of the base; front pads on the front side of the base; support patterns having a thickness greater than a thickness of each of the front pads, on the front side of the base; and a protective insulating layer having openings exposing the front pads respectively, on the front side of the base, and on an upper surface and a side surface of each of the support patterns. The base includes a plurality of base insulating layers, and an interconnection structure penetrating through the plurality of base insulating layers and electrically connecting the front pads and the rear pads.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, terms used to distinguish the components of the semiconductor package from each other may be replaced with other terms with reference to the drawings. For example, terms such as "upper" and "lower" or terms such as "front", "back" and "rear" may be replaced with other terms, for example, terms such as "first" and "second" and used to describe elements of the specification. Terms such as "first" and "second" may be used to describe various elements, but the elements are not limited by the terms, and "first element" may be referred to as "second element".

Figure 1:
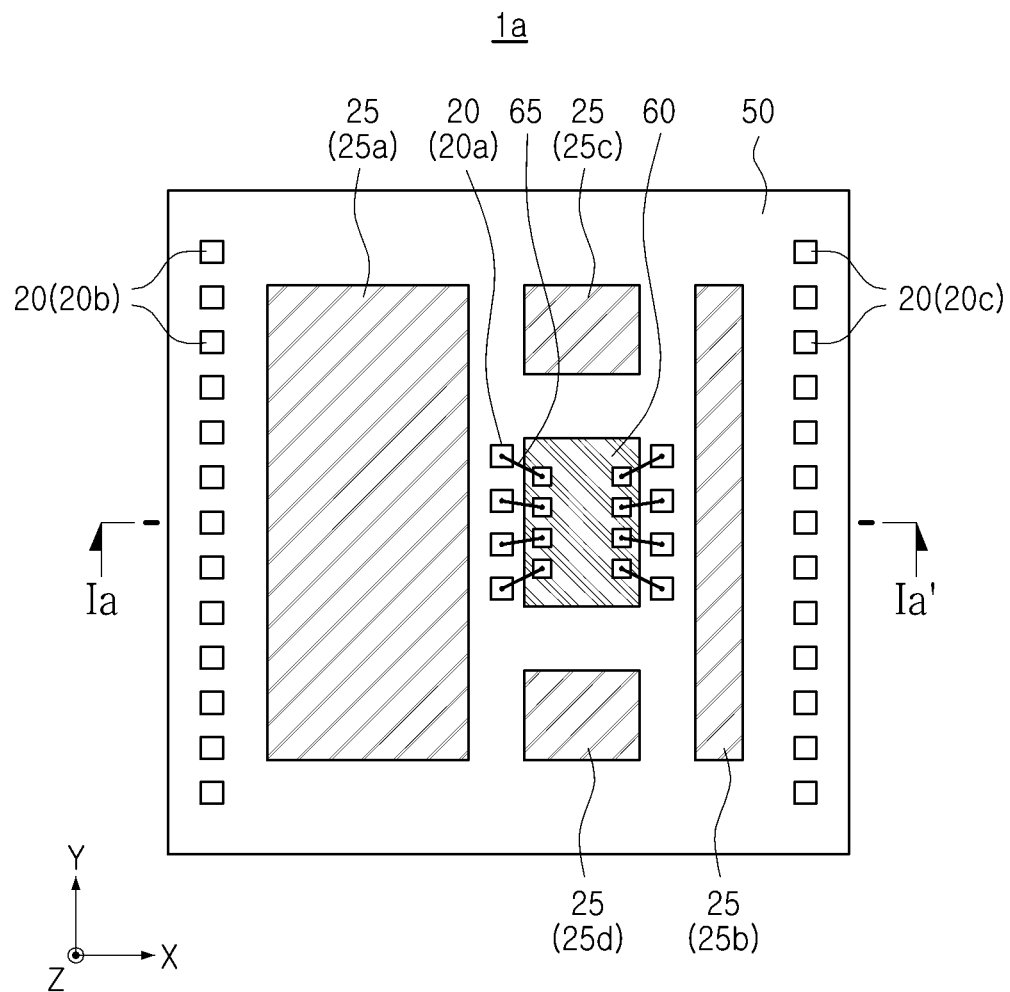
FIGS. 1 to 2B are views illustrating a package substrate and a semiconductor package including the same according to example embodiments.
Figure 2A:
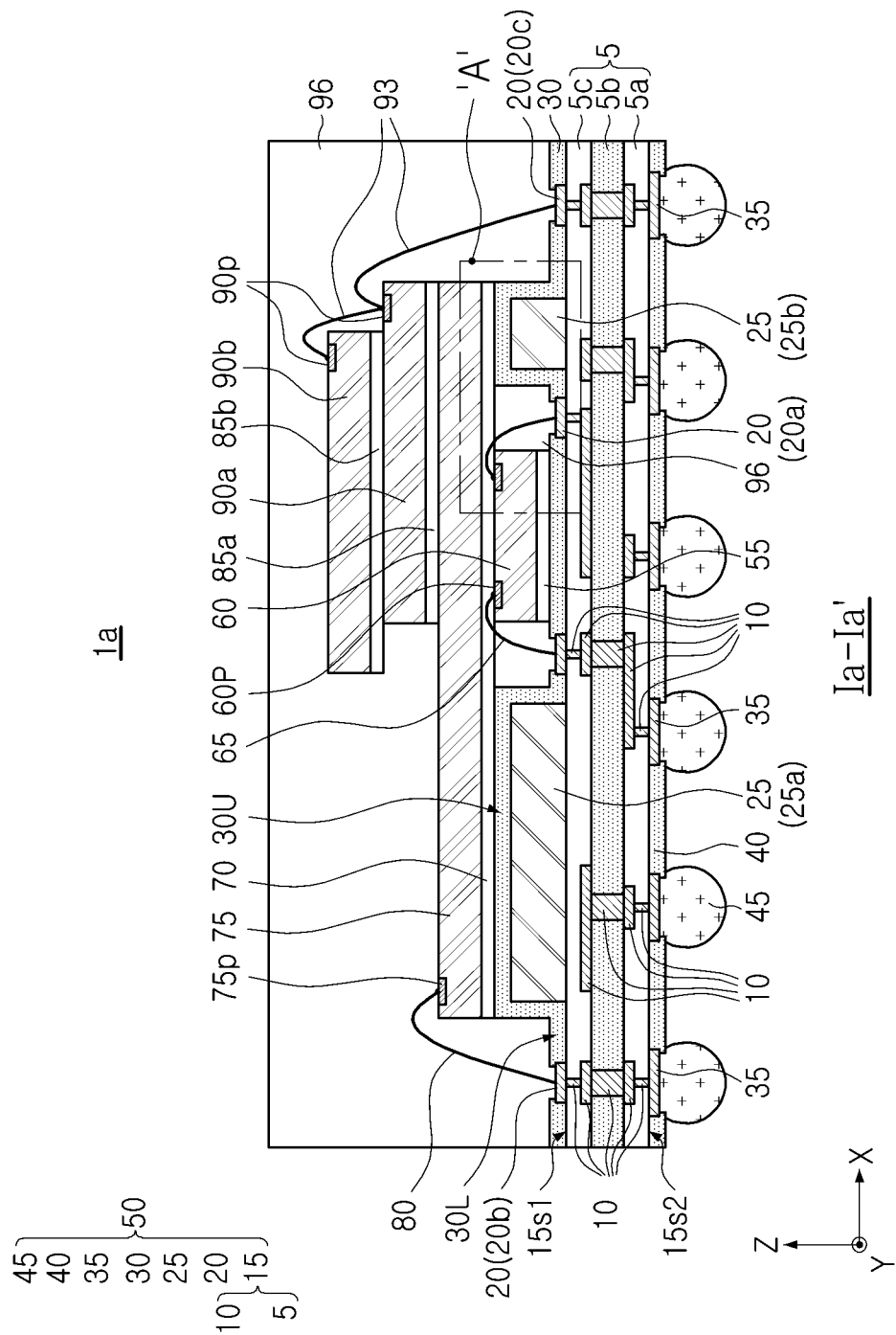
Figure 2B:
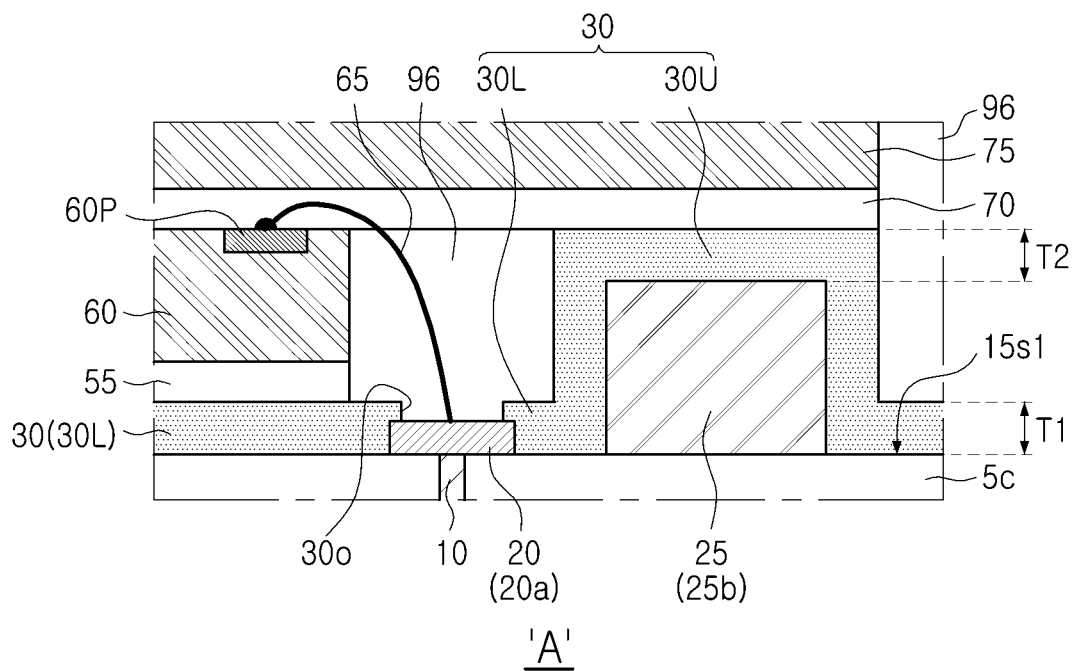

FIG. 1 is a top view illustrating a package substrate and a semiconductor package including the same according to example embodiments, FIG. 2A is a cross-sectional view illustrating an area taken along line Ia-Ia' of FIG. 1, and FIG. 2B is a partially enlarged view of the area marked with 'A' of FIG. 2A.

Referring to FIGS. 1, 2A and 2B, a package substrate 50 according to an example embodiment may include a base 15 having a front side 15s1 and an opposing back side 15s2, front pads 20 on the front side 15s1 of the base 15, support patterns 25 having a thickness greater than a thickness of each of the front pads 20 on the front side 15s1 of the base 15, and a protective insulating layer 30 having openings 300 respectively exposing the front pads 20, on the front side 15s1 of the base 15, and on an upper surface and a side surface of each of the support patterns 25.

The base 15 may include a plurality of base insulating layers 5 and a conductive structure 10 penetrating through the plurality of base insulating layers 5. The plurality of base insulating layers 5 may include first, second, and third base insulating layers 5a, 5b, and 5c that are sequentially stacked. The conductive structure 10 may include an interconnection structure electrically connecting the front pads 20 and rear pads 35.

The conductive structure 10 may include at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), or an alloy of two or more metals thereof.

The front pads 20 may be formed of a conductive material. For example, the front pads 20 may be formed of the same material as the conductive structure 10.

The support patterns 25 may be spaced apart from each other. The support patterns 25 may be formed of a conductive material. For example, the support patterns 25 may include a copper material.

The protective insulating layer 30 may include a solder resist material or a photo solder resist material.

The package substrate 50 may further include the rear pads 35 below the back side 15s2 of the base 15, a rear insulating layer 40 having openings to expose the rear pads 35, below the back side 15s2 of the base 15, and lower connection patterns 45 contacting the rear pads 35, below the rear pads 35. The lower connection patterns 45 may have a land, ball, or pin shape. The lower connection patterns 45 may include a solder material, for example, tin (Sn) or an alloy including tin (Sn) (e.g., Sn—Ag—Cu). The lower connection patterns 45 may be electrically connected to an external device such as a module board or a system board.

In an example, the package substrate 50 may be a printed circuit board. In another example, the package substrate 50 may be a redistribution substrate. In another example, the package substrate 50 may be an interposer substrate.

A semiconductor package 1a according to an example embodiment may include the package substrate 50.

The semiconductor package 1a may include a lower semiconductor chip 60 on the package substrate 50, a first upper semiconductor chip 75, and one or more second upper semiconductor chips 90a and 90b.

The lower semiconductor chip 60 may be on the protective insulating layer 30 and may be between at least two of the support patterns 25 in a top view. For example, in a top view, the support patterns 25 may include a first support pattern 25a and a second support pattern 25b that are arranged in a first horizontal direction X, and a third support pattern 25c and a fourth support pattern 25d arranged in a second horizontal direction (Y) perpendicular to the first horizontal direction X. The first and second horizontal directions X and Y may be parallel to the front side 15s1 of the base 15. The lower semiconductor chip 60 may be between the first support pattern 25a and the second support pattern 25b and between the third support pattern 25c and the fourth support pattern 25d. Accordingly, the lower semiconductor chip 60 may be surrounded by the first to fourth support patterns 25a, 25b, 25c, and 25d.

The first and second support patterns 25a and 25b may have a line shape or a bar shape extending in the second horizontal direction (Y). The first support pattern 25a may have a width greater than the width of the second support pattern 25b.

The first and second support patterns 25a and 25b may have a larger size than the third and fourth support patterns 25c and 25d.

A center of the lower semiconductor chip 60 may deviate from a center of the package substrate 50. For example, the center of the lower semiconductor chip 600 may be located between the center of the package substrate 50 and one side of the package substrate 50.

The protective insulating layer 30 may include a first portion 30U positioned on an upper surface of each of the support patterns 25, and a second portion that does not cover the support patterns 25 and the front pads 20. A portion of the second portion 30L may be located below the lower semiconductor chip 60.

In the protective insulating layer 30, the thickness of the first portion 30U may be in a range of about 10 μm to about 20 μm.

In the protective insulating layer 30, the thickness of the second portion 30L of the protective insulating layer 30 positioned below the lower semiconductor chip 60 may range from about 10 μm to about 40 μm.

The thickness of the lower semiconductor chip 60 may be in a range of about 70 μm to about 200 μm.

The upper surface of the lower semiconductor chip 60 and the upper surface of the first portion 30U of the protective insulating layer 30 positioned on the upper surface of each of the support patterns 25 may be located substantially on the same level.

The front pads 20 may include a first front pad 20a, a second front pad 20b, and a third front pad 20c.

The semiconductor package 1a may further include a first adhesive layer 55 in contact with the lower surface of the lower semiconductor chip 60 and the protective insulating layer 30 positioned below the lower semiconductor chip 60.

The semiconductor package 1a may further include a first bonding wire 65 electrically connecting a chip pad 60P of the lower semiconductor chip 60 and the first front pad 20a.

The first upper semiconductor chip 75 may vertically overlap the lower semiconductor chip 60 and the support patterns 25 on the package substrate 50.

The semiconductor package 1a may further include a second adhesive layer 70. The second adhesive layer 70 may contact a lower surface of the first upper semiconductor chip 75, an upper surface of the protective insulating layer 30 positioned on upper surfaces of the support patterns 25, and an upper surface of the lower semiconductor chip 60.

The semiconductor package 1a may further include a second bonding wire 80 electrically connecting the chip pad 75p of the first upper semiconductor chip 75 and the second front pad 20b.

The one or more second upper semiconductor chips 90a and 90b may be on the first upper semiconductor chip 75. The one or more second upper semiconductor chips 90a and 90b may be provided as a plurality of upper semiconductor chips. The semiconductor package 1a may further include third adhesive layers 85a and 85b contacting lower surfaces of the plurality of second upper semiconductor chips 90a and 90b, respectively.

The semiconductor package 1a may further include a third bonding wire 93 electrically connecting the chip pads 90p of the plurality of second upper semiconductor chips 90a and 90b and the third front pad 20c to each other.

The lower semiconductor chip 60, the first upper semiconductor chip 75, and the plurality of second upper semiconductor chips 90a and 90b may be on different height levels. Accordingly, the semiconductor package 1a may include a plurality of semiconductor chips stacked in the vertical direction Z on the package substrate 50, for example, the lower semiconductor chip 60, the first upper semiconductor chip 75, and the plurality of second upper semiconductor chips 90a and 90b.

The semiconductor package 1a may further include an encapsulant 96 on the package substrate 50. The encapsulant 96 may be on the first upper semiconductor chip 75 and the plurality of second upper semiconductor chips 90a and 90b and may be in contact with a portion of the protective insulating layer 30 and a side surface of the lower semiconductor chip 60. The encapsulant 96 may be Epoxy Molding Compound (EMC).

In an example embodiment, the lower semiconductor chip 60, the first upper semiconductor chip 75, and the one or more second upper semiconductor chips 90a and 90b may be different types of semiconductor chips. For example, the lower semiconductor chip 60 may be a controller semiconductor chip, the first upper semiconductor chip 75 may be a DRAM memory semiconductor chip, and one or more second upper semiconductor chips 90a and 90b may be a NAND flash memory semiconductor chip. Accordingly, the semiconductor package 1a may include at least two types, for example, three types of semiconductor chips. Accordingly, by including various types of semiconductor chips in one semiconductor package 1a, it is possible to provide the semiconductor package 1a which is miniaturized, has high performance, and has high reliability. In addition, the one or more second upper semiconductor chips 90a and 90b, which may be NAND flash memory semiconductor chips for storing data, may be provided in plurality. Accordingly, the semiconductor package 1a having an increased data storage capacity may be provided.

In an example embodiment, the types of the lower semiconductor chip 60, the first upper semiconductor chip 75, and the one or more second upper semiconductor chips 90a and 90b may not be limited to the above-described controller semiconductor chip, DRAM memory semiconductor chip and NAND flash memory semiconductor chip. For example, the first upper semiconductor chip 75 may include at least one of the following: logic chips, such as a central processor (CPU), a graphics processor (GPU), a field programmable gate array (FPGA), a digital signal processor, an encryption processor, a microprocessor, a microcontroller, an analog-to-digital converter, and an application-specific IC (ASIC). At least one of the second upper semiconductor chips 90a and 90b may include at least one of a volatile memory semiconductor chip (e.g., DRAM memory semiconductor chip) or non-volatile memory (e.g., NAND flash memory semiconductor chip).

In an example embodiment, the support patterns 25 may be formed as metal posts formed of a metal material, for example, copper posts (Cu posts), which may be easily adjusted in thickness, inexpensively formed compared to a dummy semiconductor chip, and formed in various shapes or sizes, thereby improving productivity.

In an example embodiment, the lower semiconductor chip 60 may be closer to the third front pad 20c than to the second front pad 20b. For example, the distance between the lower semiconductor chip 60 and the third front pad 20c may be smaller than the distance between the lower semiconductor chip 60 and the second front pad 20b. Accordingly, it is possible to reduce the routing distance between the controller semiconductor chip, for example, the lower semiconductor chip 60 and the NAND flash memory semiconductor chip, for example, the one or more second upper semiconductor chips 90a and 90b, and thus, performance of the semiconductor package 1a, for example, signal integrity (SI) characteristics, may be improved.

In an example embodiment, the support patterns 25 may serve to prevent the first upper semiconductor chip 75 from being bent or deformed. For example, the support patterns 25, which may be formed of a metal material whose thickness and size may be easily adjusted, may change in thickness according to the thickness of the lower semiconductor chip 60. Accordingly, the support patterns 25 and the first portions 30U of the protective insulating layer 30 on upper surfaces of the support patterns 25 may support the first upper semiconductor chip 75 together with the lower semiconductor chip 60 and may reduce or prevent bending or deformation of the first upper semiconductor chip 75.

In an example embodiment, the support patterns 25 may be sized or positioned such that the encapsulant 96 fills spaces between the support patterns 25 and the lower semiconductor chip 60 without voids.

In an example embodiment, the support patterns 25 may be formed as various shapes or sizes to reduce or prevent the semiconductor package 1a from being bent or deformed.

Figure 3:
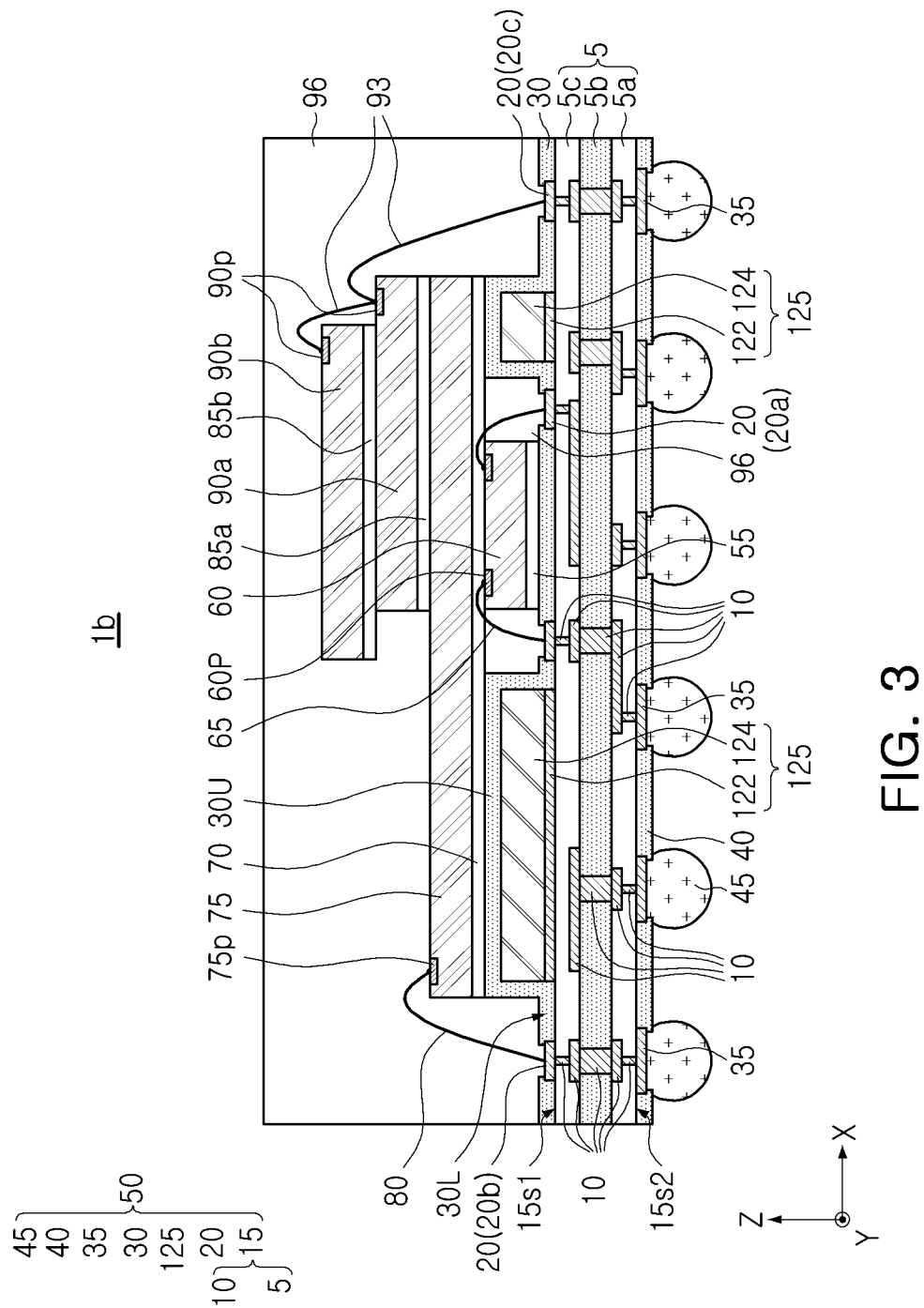
FIG. 3 is a cross-sectional view illustrating a modified example of a semiconductor package according to an example embodiment.
Figure 4:
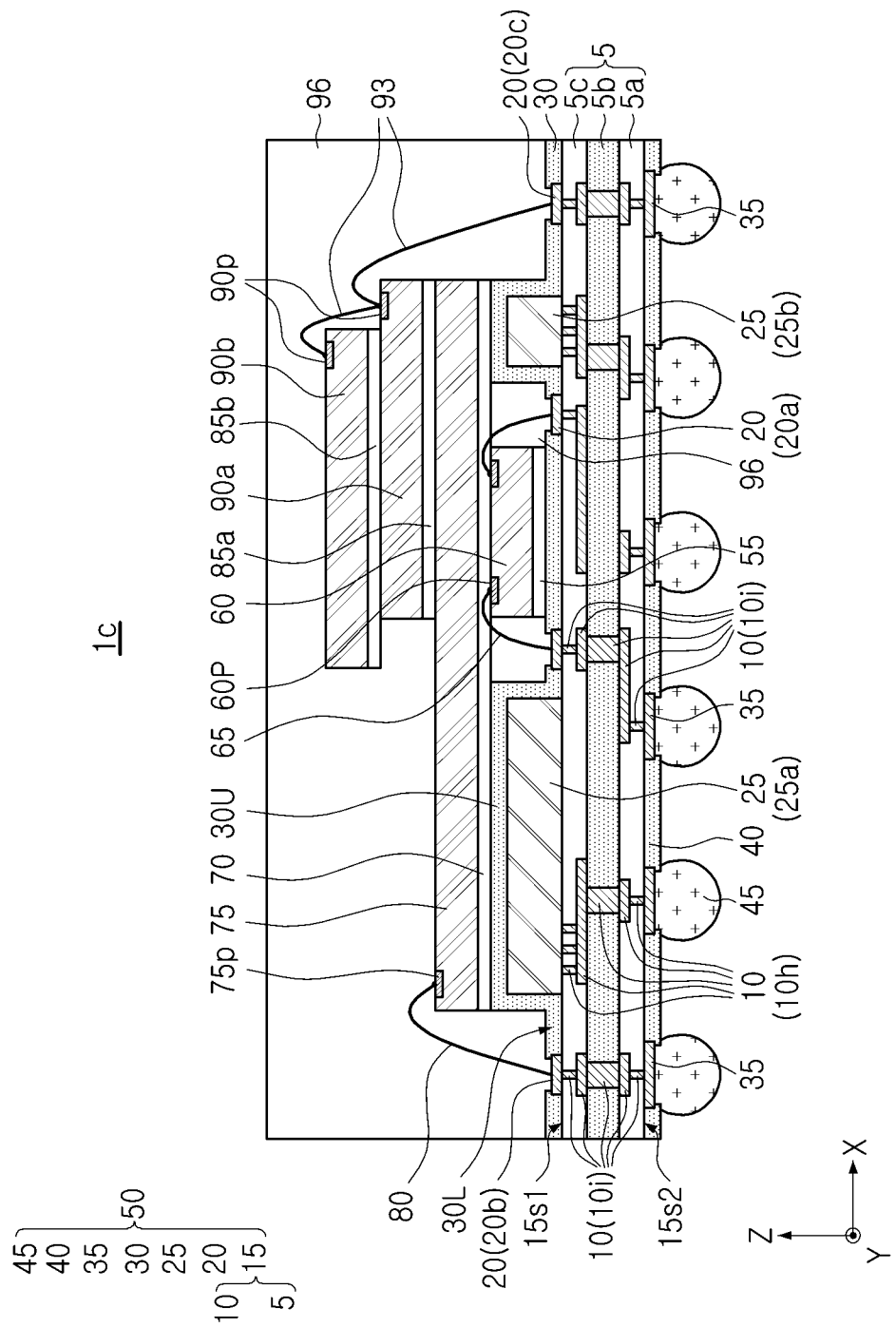
FIG. 4 is a cross-sectional view illustrating a modified example of a semiconductor package according to an example embodiment.
Figure 5:
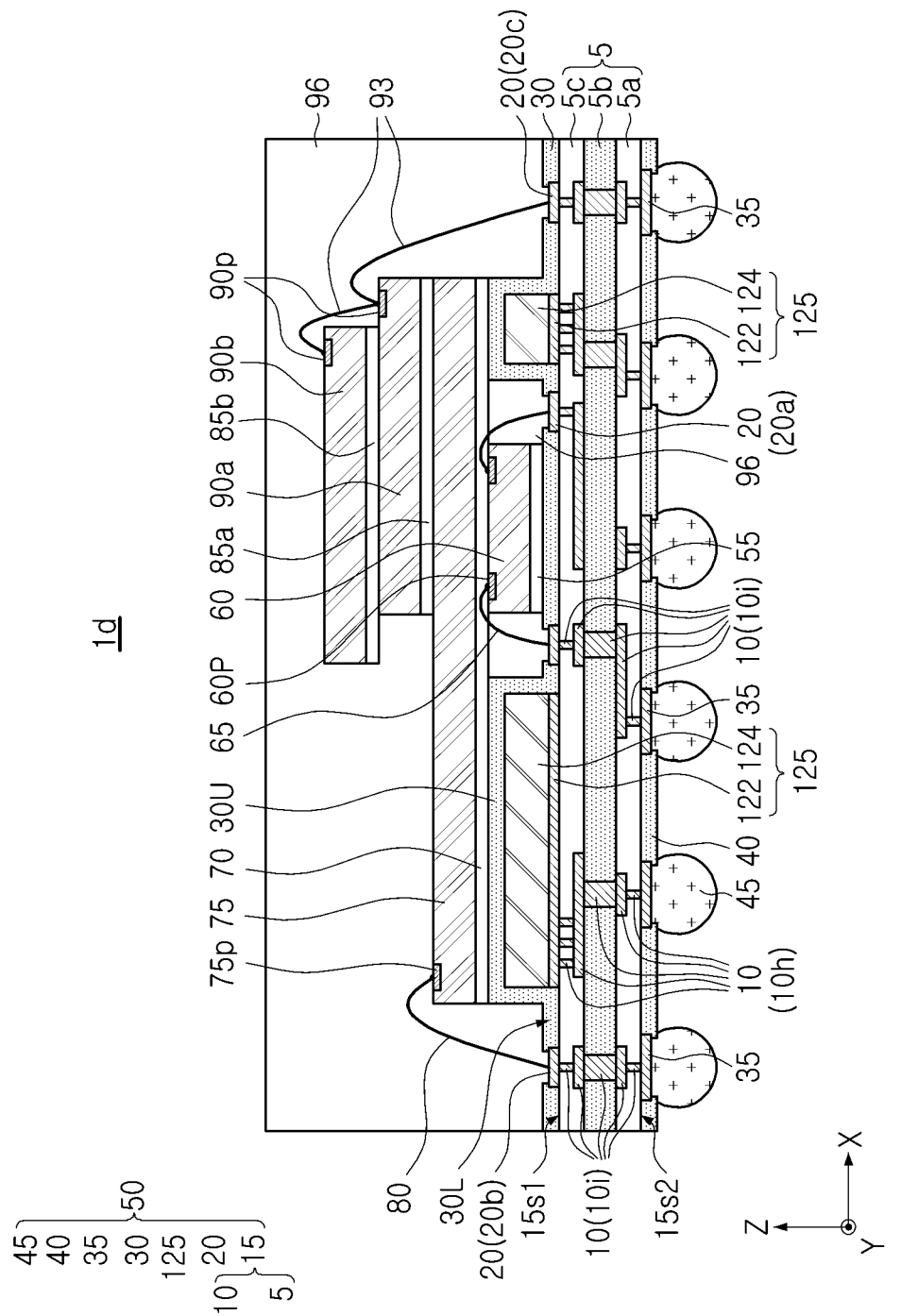
FIG. 5 is a cross-sectional view illustrating a modified example of a semiconductor package according to an example embodiment.

Next, various modifications of the semiconductor package according to an example embodiment will be described with reference to FIGS. 3, 4 and 5, respectively. FIGS. 3, 4, and 5 are cross-sectional views illustrating various modified examples of a semiconductor package according to an example embodiment.

In a modified example, referring to FIG. 3, a semiconductor package 1b in the modified example may include support patterns 125 that may replace the support patterns 25 described with reference to FIGS. 1 to 2B. For example, each of the support patterns 125 may include a first support layer 122 and a second support layer 124 that are sequentially stacked. The first support layer 122 may be formed of the same material and the same thickness as the front pads 20. The second support layer 124 may have a thickness greater than that of the first support layer 122. The first support layer 122 may include a copper material. The second support layer 124 may include a copper material, but embodiments are not limited thereto. For example, the second support layer 124 may include a metal material and/or an insulating material that may be adhered to the first support layer 122.

In a modified example, referring to FIG. 4, a semiconductor package 1c in the modified example may further include a heat dissipation structure 10h. The heat dissipation structure 10h may be included in the package substrate 50 described with reference to FIGS. 1 to 2B. The heat dissipation structure 10h may be a portion of the conductive structure 10 of the base 15. The heat dissipation structure 10h may be electrically isolated and may be in contact with the support patterns 25, and in the conductive structure 10, may be referred to as an interconnection structure 10i electrically connecting the front pads 20 and the rear pads 35. Accordingly, the conductive structure 10 may include the interconnection structure 10i and the heat dissipation structure 10h. The heat dissipation structure 10h may improve heat dissipation characteristics of the semiconductor package 1c.

In a modified example, referring to FIG. 5, a semiconductor package 1d in the modified example may include the support patterns 125 as described in FIG. 3 and the heat dissipation structure 10h as described in FIG. 4. Each of the support patterns 125 may include the first support layer 122 and the second support layer 124 stacked in sequence, and the first support layers 122 of the support patterns 125 may be in contact with the heat dissipation structure 10h.

In some embodiments, the support patterns 25 and 125 may be in various shapes or sizes to reduce or prevent bending or deformation of the semiconductor package 1a. Hereinafter, illustrative examples in which the support patterns 25 and 125 are deformed in various shapes and sizes will be described with reference to FIGS. 6, 7, and 8A to 8G.

Figure 6:
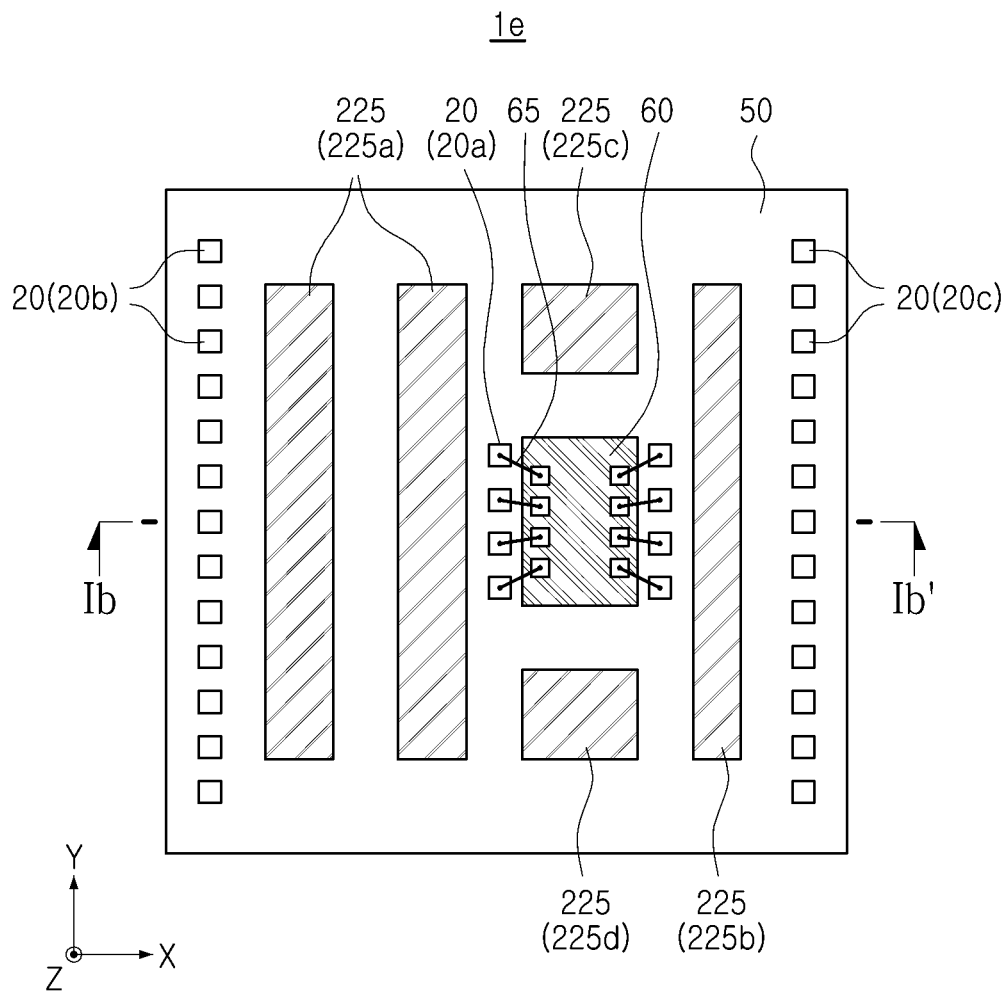
FIGS. 6 and 7 are views illustrating a modified example of a semiconductor package according to an example embodiment.

First, a modified example of a semiconductor package according to an example embodiment will be described with reference to FIGS. 6 and 7. FIG. 6 is a top view illustrating a modified example of a semiconductor package according to an example embodiment, and FIG. 7 is a cross-sectional view illustrating a region taken along the line Ib-Ib' of FIG. 6.

Figure 7:
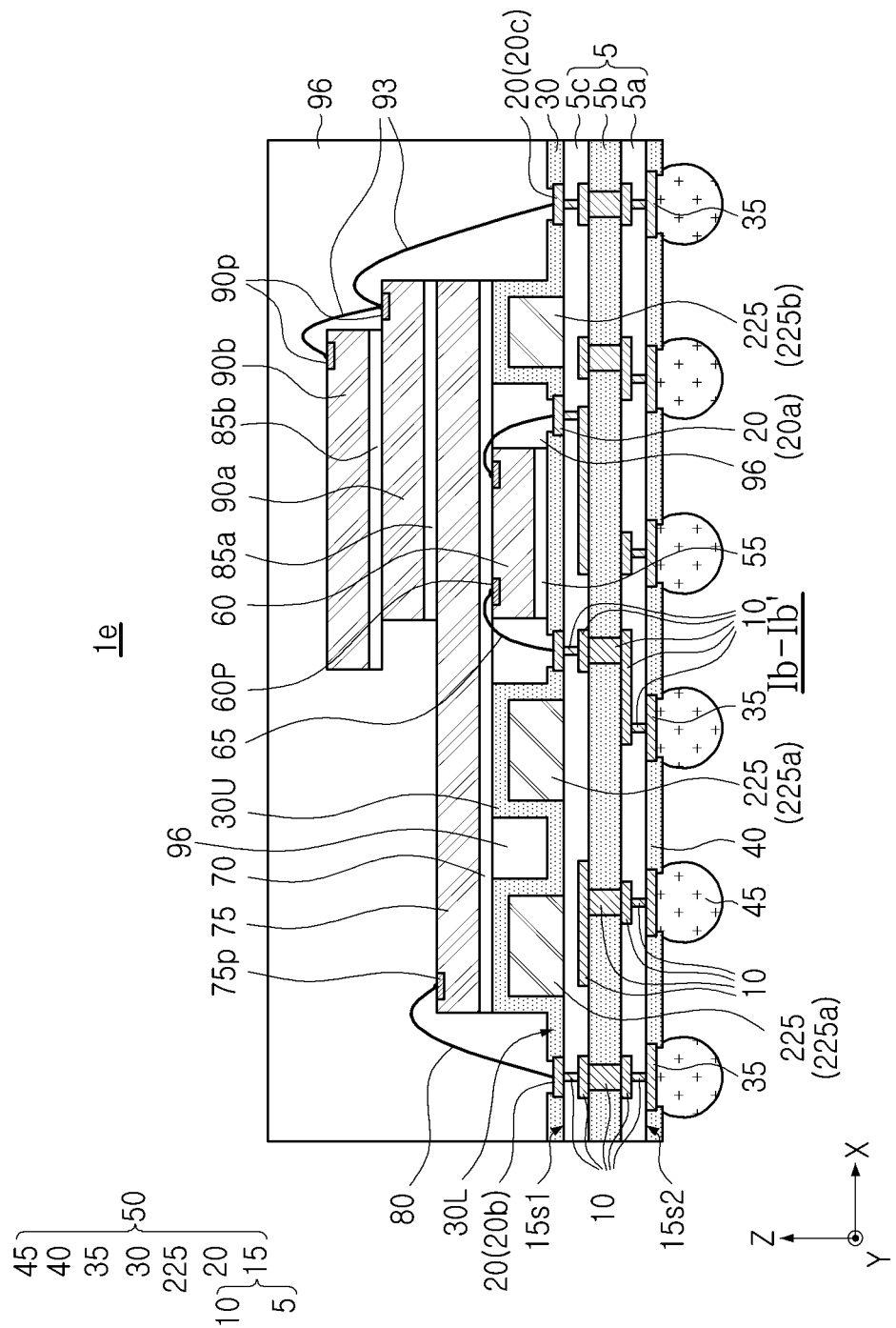

In a modified example, referring to FIGS. 6 and 7, a semiconductor package 1d in the modified example may include support patterns 225 that may replace the support patterns 25 in FIG. 1. For example, the support patterns 225 may include first support patterns 225a and second support pattern 225b arranged in the first horizontal direction (X), and a third support pattern 225c and a fourth support pattern 225d arranged in the second horizontal direction (Y).

In the top view of FIG. 6, the first support patterns 225a may be in plural on one side of the lower semiconductor chip 60. Accordingly, in the top view as illustrate in FIG. 6, the number of the first support patterns 225a on the left side of the lower semiconductor chip 60 may be more than the number of the second support patterns 225b on the right side of the lower semiconductor chip 60.

Next, various examples of the support patterns in a top view in the semiconductor package according to an example embodiment will be described with reference to FIGS. 8A to 8G, respectively. FIGS. 8A to 8G are top views illustrating various modified examples of a semiconductor package according to an example embodiment.

Figure 8A:
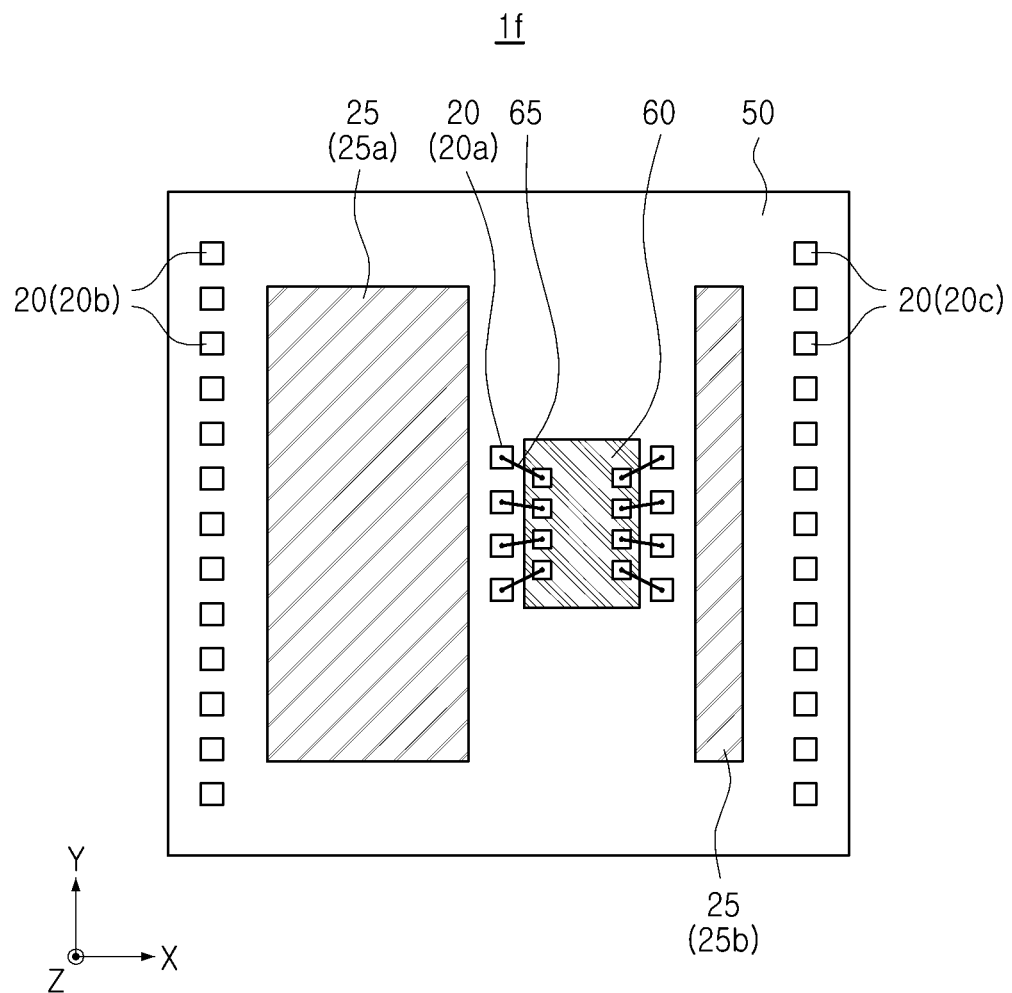
FIG. 8A is a top view illustrating a modified example of a semiconductor package according to an example embodiment.

In a modified example, referring to FIG. 8A, a semiconductor package 1f in the modified example may include support patterns 25 from which the third and fourth support patterns 25c and 25d among the first to fourth support patterns 25a, 25b, 25c, and 25d described with reference to FIG. 1 are omitted. Accordingly, the lower semiconductor chip 60 may be between the first and second support patterns 25a and 25b.

Figure 8B:
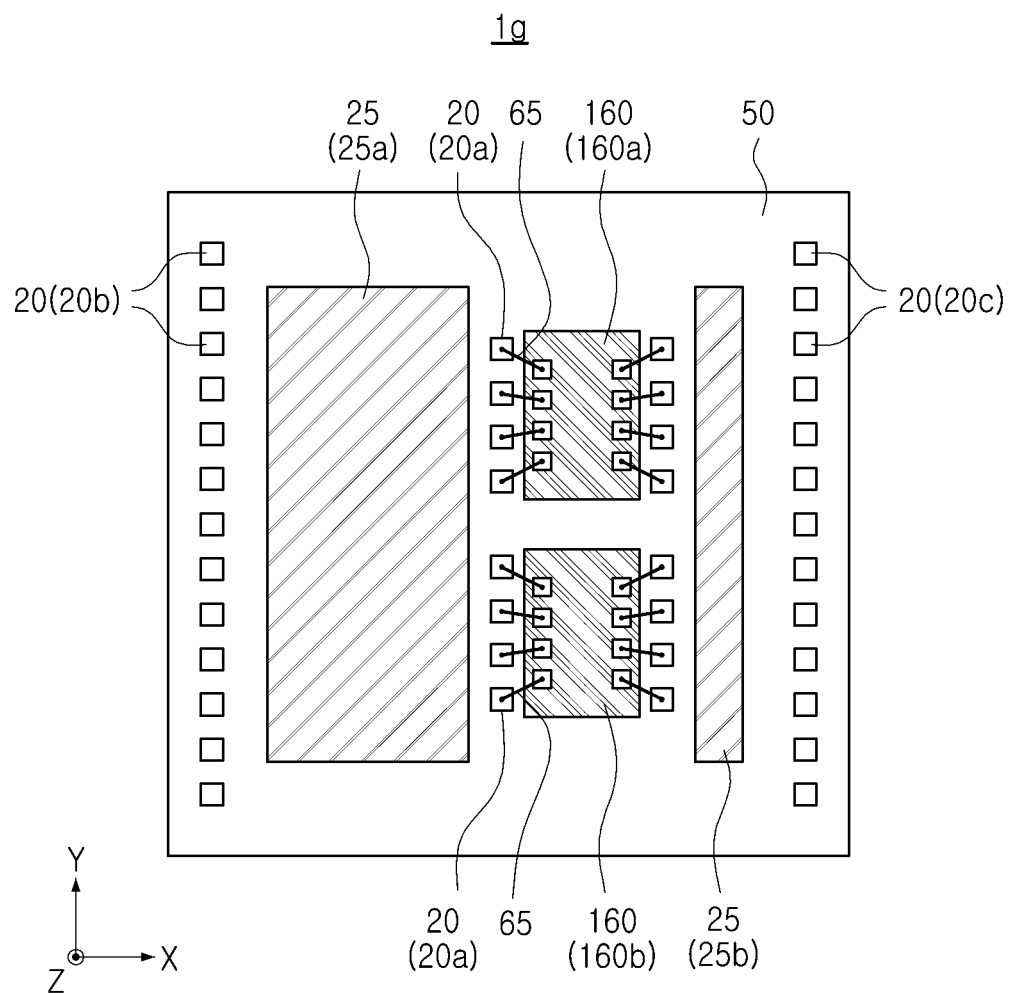
FIG. 8B is a top view illustrating a modified example of a semiconductor package according to an example embodiment.

In a modified example, referring to FIG. 8B, a semiconductor package 1g in the modified example may include a plurality of lower semiconductor chips 160 that may replace the lower semiconductor chip 60 described in FIG. 1. The plurality of lower semiconductor chips 160 may be on the same plane and may be spaced apart from each other. The plurality of lower semiconductor chips 160 may include a first lower semiconductor chip 160a and a second lower semiconductor chip 160b that are spaced apart from each other in the second horizontal direction (Y).

The semiconductor package 1g may include support patterns 25 in which the third and fourth support patterns 25c and 25d among the first to fourth support patterns 25a, 25b, 25c, and 25d described in FIG. 1 are omitted. Accordingly, the plurality of lower semiconductor chips 160 may be between the first support pattern 25a and the second support pattern 25b.

Figure 8C:
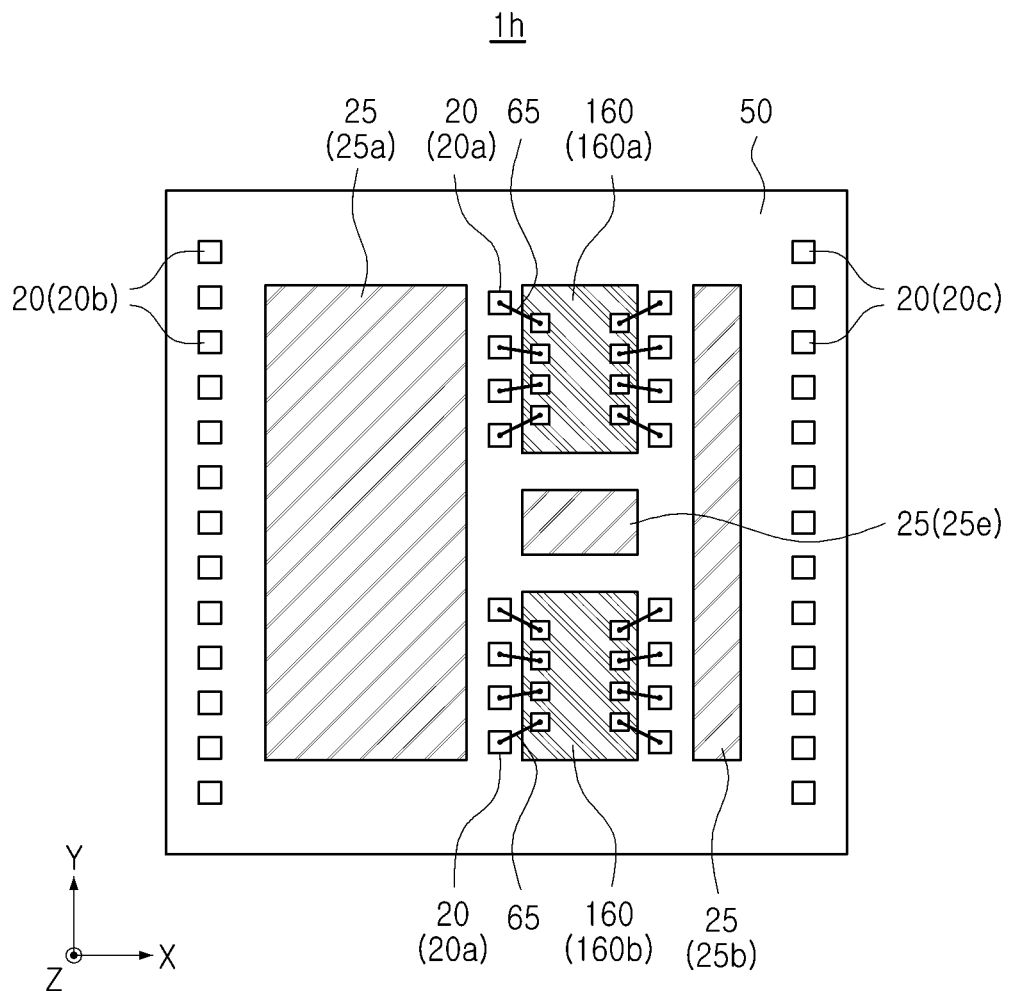
FIG. 8C is a top view illustrating a modified example of a semiconductor package according to an example embodiment.

In a modified example, referring to FIG. 8C, a semiconductor package 1h in the modified example may include a plurality of lower semiconductor chips 160 that may replace the lower semiconductor chip 60 described in FIG. 1. The plurality of lower semiconductor chips 160 may include a first lower semiconductor chip 160a and a second lower semiconductor chip 160b that are spaced apart from each other in the second horizontal direction (Y).

The semiconductor package 1g may include support patterns 25 in which the third and fourth support patterns 25c and 25d among the first to fourth support patterns 25a, 25b, 25c, and 25d described in FIG. 1 are omitted. The support patterns 25 may further include an intermediate support pattern 25e between the first lower semiconductor chip 160a and the second lower semiconductor chip 160b.

Figure 8D:
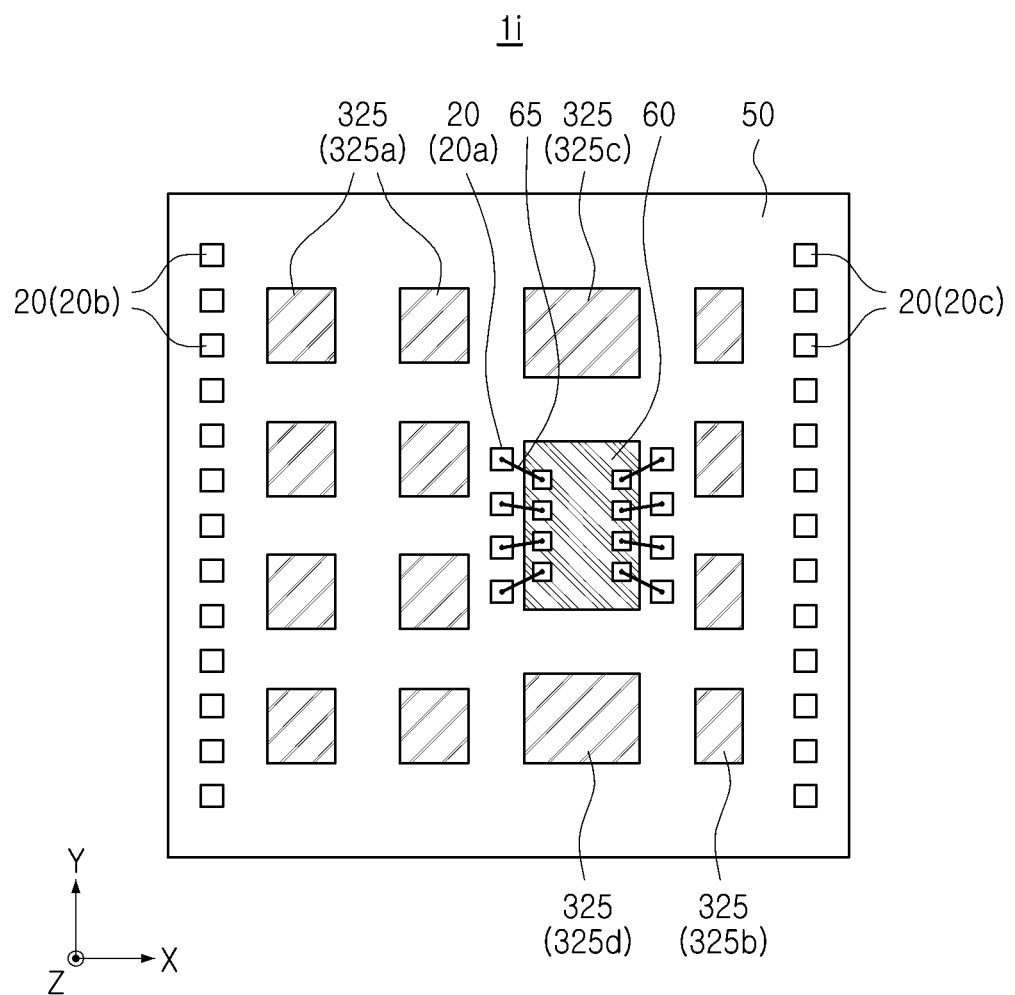
FIG. 8D is a top view illustrating a modified example of a semiconductor package according to an example embodiment.

In a modified example, referring to FIG. 8D, a semiconductor package 1i in the modified example may include support patterns 325 that may replace the support patterns 25 in FIG. 1. The support patterns 325 may include first support patterns 325a spaced apart from each other by dividing the first support pattern 25a of FIG. 1 described in FIG. 1, second support pattern 325b spaced apart from each other by dividing the second support pattern (refer 25b of FIG. 1) described with reference to FIG. 1, and third and fourth support patterns 325c and 325d corresponding to the third and fourth support patterns (25c and 25d of FIG. 1) described in FIG. 1, respectively. The first support patterns 325a may be arranged in the first horizontal direction (X) and the second horizontal direction (Y). The support patterns 325 may have a dot shape or a square shape.

Figure 8E:
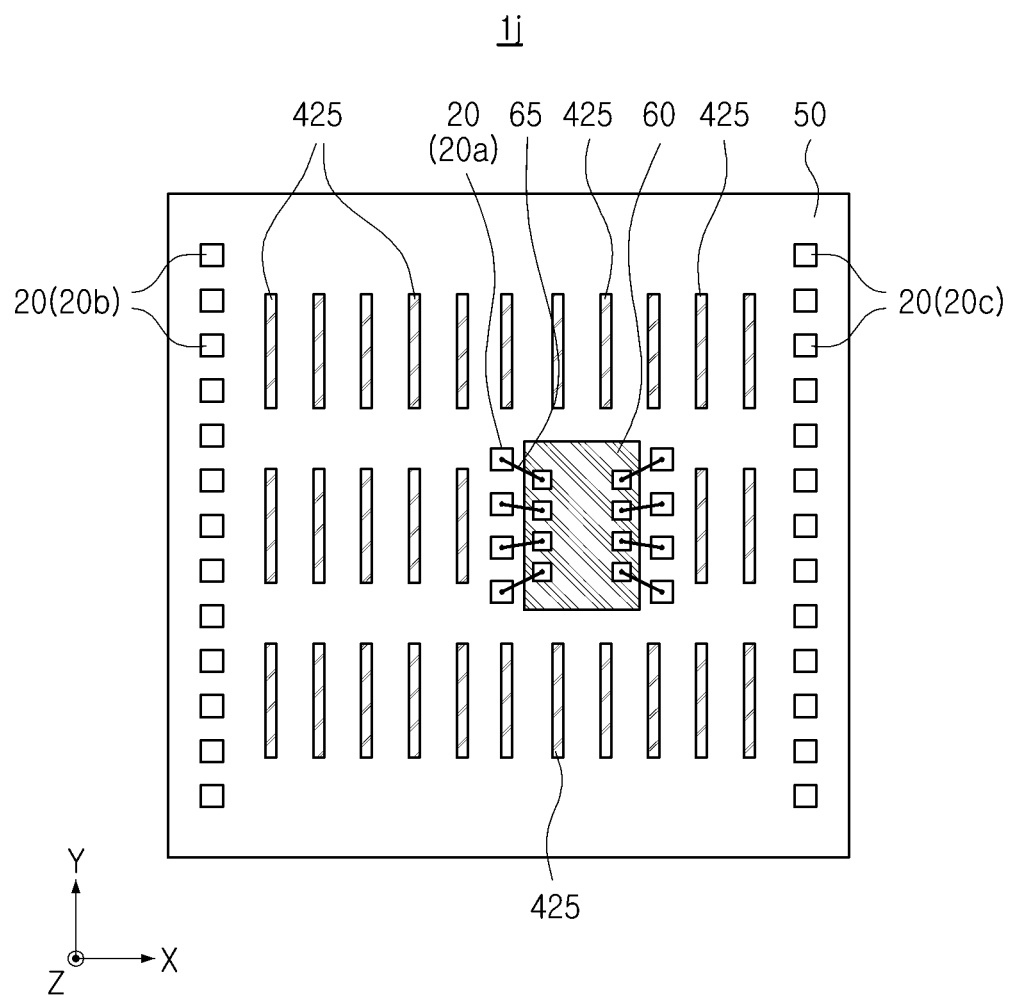
FIG. 8E is a top view illustrating a modified example of a semiconductor package according to an example embodiment.

In a modified example, referring to FIG. 8E, a semiconductor package 1j in the modified example may include support patterns 425 that may replace the support patterns 25 in FIG. 1. Each of the support patterns 425 may have a line shape or a bar shape extending in any one direction, for example, the second direction Y.

Figure 8F:
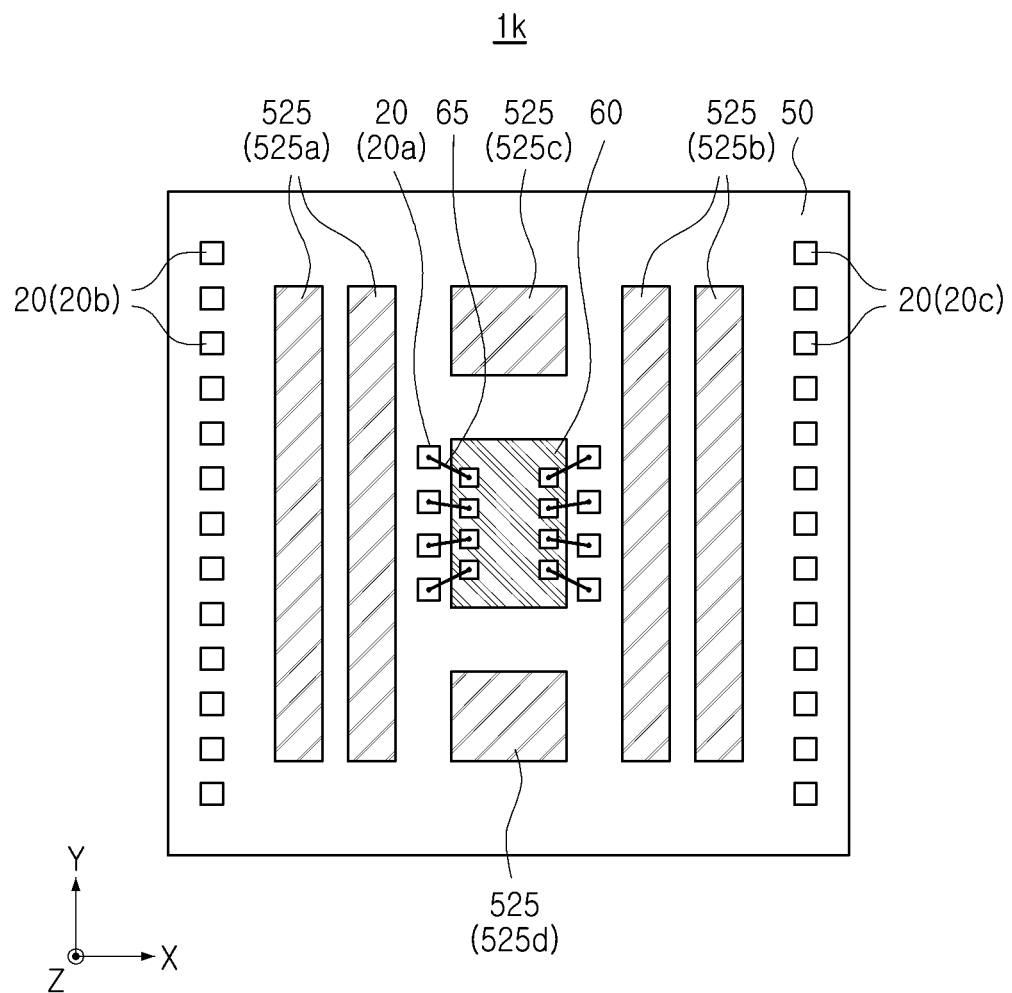
FIG. 8F is a top view illustrating a modified example of a semiconductor package according to an example embodiment.

In a modified example, referring to FIG. 8F, a semiconductor package 1k in the modified example may include support patterns 525 that may replace the support patterns 25 in FIG. 1. In a top view, the support patterns 525 may include a plurality of first support patterns 525a on the left side of the lower semiconductor chip 60, a plurality of second support patterns 525b on the right side of the lower semiconductor chip 60, a third support pattern 525c above the lower semiconductor chip 60, and a fourth support pattern 525d below the lower semiconductor chip 600.

The length of each of the first and second support patterns 525a and 525b in the second vertical direction Y may be greater than the length of each of the third and fourth support patterns 525c and 525d in the second vertical direction Y. A length of each of the first and second support patterns 525a and 525b in the second vertical direction Y may be greater than a length of the lower semiconductor chip 60 in the second vertical direction Y.

The center of the lower semiconductor chip 60 may be in a position deviated from the center of the package substrate 50, but the example embodiment of the present inventive concept is not limited thereto. For example, the center of the lower semiconductor chip 60 may coincide with the center of the package substrate 50.

Figure 8G:
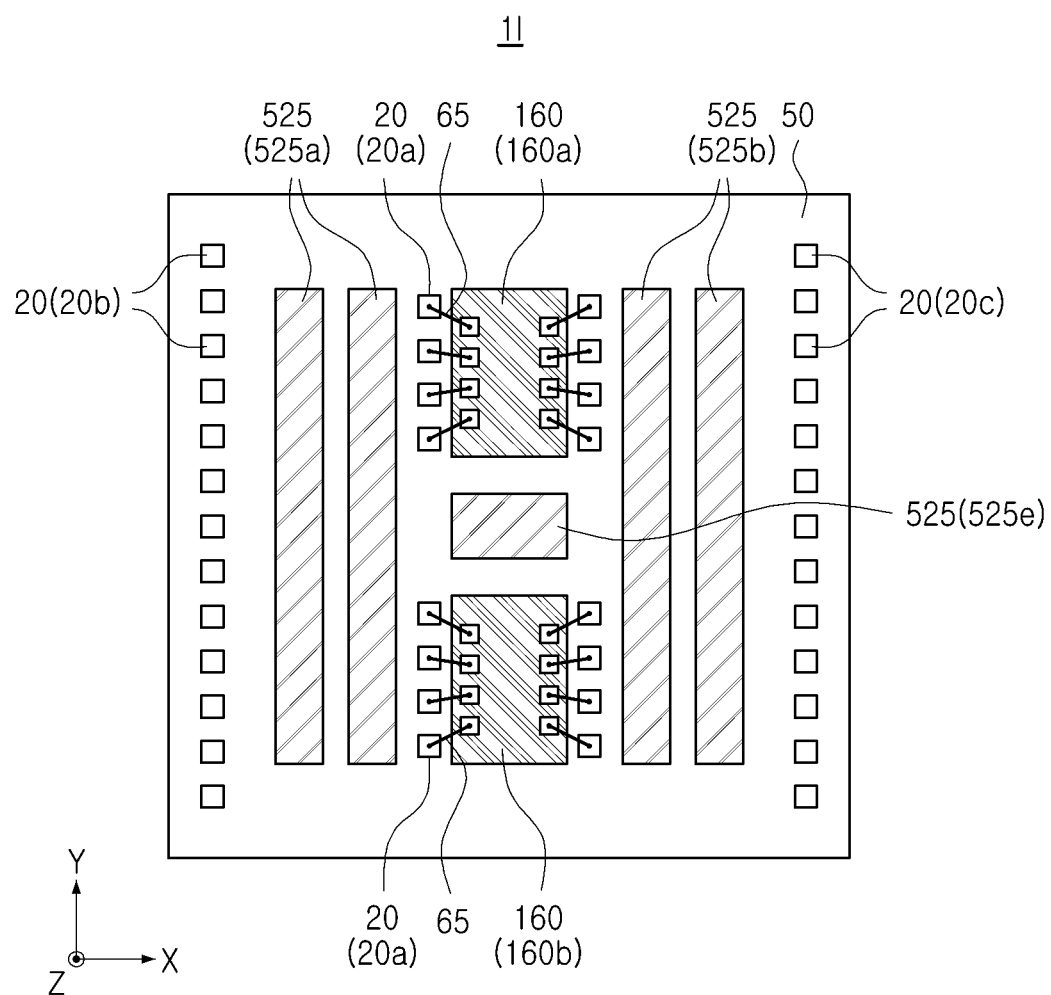
FIG. 8G is a top view illustrating a modified example of a semiconductor package according to an example embodiment.

In a modified example, referring to FIG. 8G, a semiconductor package 1l in the modified example may include support patterns 525 in which the third and fourth support patterns 525c and 525d among the first to fourth support patterns 525a, 525b, 525c and 525d in FIG. 8F are omitted. Accordingly, the support patterns 525 may include the first support patterns 525a and the second support patterns 525b. The semiconductor package 1l in the modified example may include a plurality of lower semiconductor chips 160 that may replace the lower semiconductor chip 60 described with reference to FIG. 1. The plurality of lower semiconductor chips 160 may include a first lower semiconductor chip 160a and a second lower semiconductor chip 160b that are spaced apart from each other in the second horizontal direction (Y). The support patterns 525 may further include an intermediate support pattern 525e between the first lower semiconductor chip 160a and the second lower semiconductor chip 160b.

Figure 9:
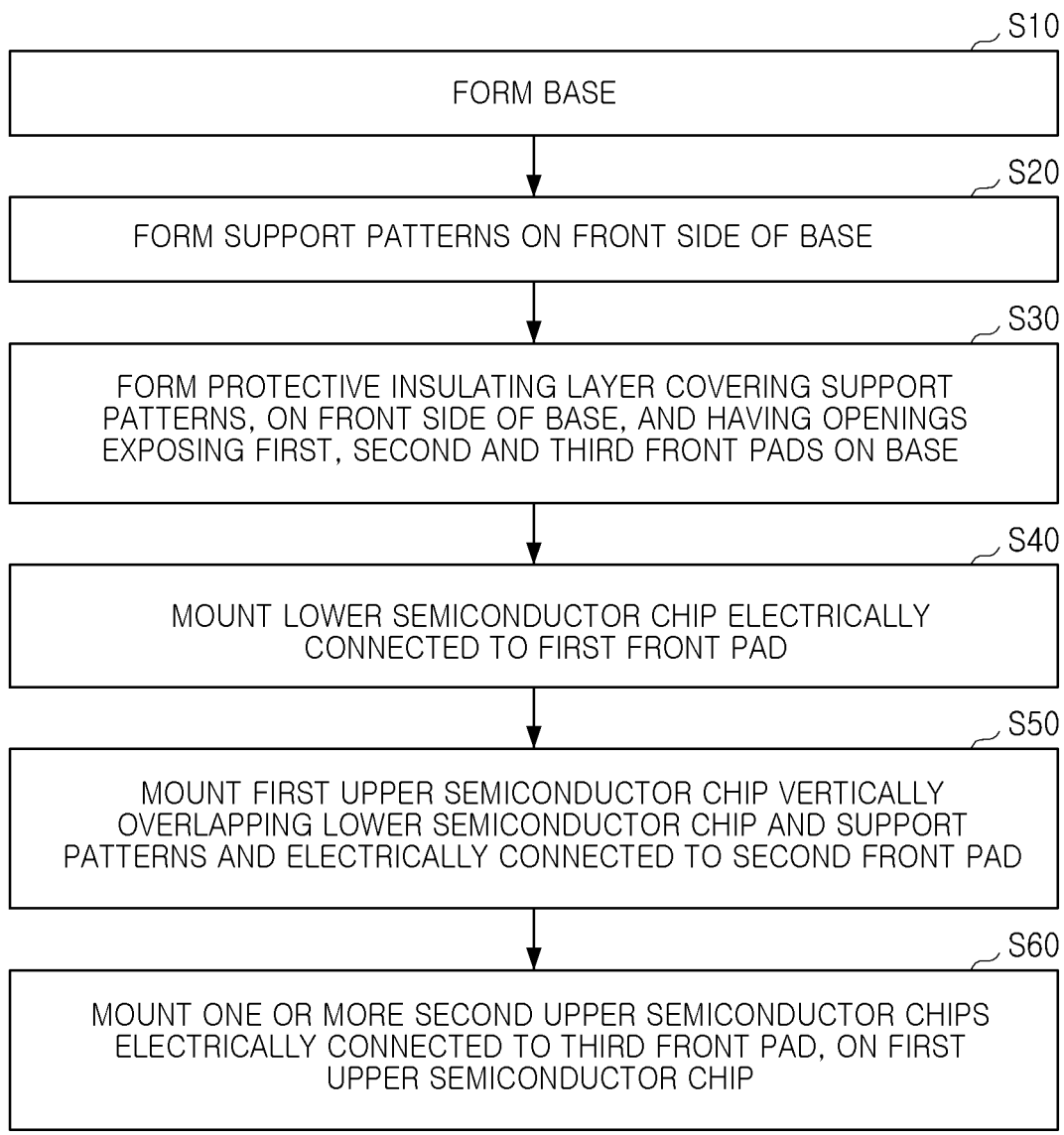
FIG. 9 is a process flow diagram illustrating an illustrative example of a method of forming a semiconductor package according to an example embodiment.

Next, referring to FIG. 9, an illustrative example of a method of forming a semiconductor package according to an example embodiment will be described with reference to FIG. 9. FIG. 9 is a process flow diagram illustrating an example of a method of forming a semiconductor package according to an example embodiment.

Referring to FIG. 9 together with FIGS. 1 to 2B, the base 15 may be formed (S10). The base 15 may have the front side 15s1 and the back side 15s2 opposing each other. The base 15 may include the plurality of base insulating layers 5 and the conductive structure 10 penetrating through the plurality of insulating layers 5.

The support patterns 25 may be formed on the front side 15s1 of the base 15 (S20). The protective insulating layer 30 may be formed on the support patterns 25, on the front side 15s1 of the base 15, and to have the openings 300 exposing the first, second and third front pads 20a, 20b and 20c on the base 15 (S30). The front pads 20 including the first to third front pads 20a, 20b and 20c may be formed like a portion of the conductive structure 10.

The support patterns 25 may be formed of a conductive material such as a copper material.

The protective insulating layer 30 may be on an upper surface and a side surface of each of the support patterns 25. The protective insulating layer 30 may be formed of a solder resist material or a photo solder resist material.

In an example, the support patterns 25 may be formed after the front pads 20 are formed.

In another example, the support patterns 25 may be replaced with the support patterns (125 in FIG. 3) formed by including forming the first support layer (122 in FIG. 3) simultaneously with the front pads 20 and forming the second support layer (124 in FIG. 3) on the first support layer (122 in FIG. 3).

The lower semiconductor chip 60 electrically connected to the first front pad 20a may be mounted (S40). Mounting the lower semiconductor chip 60 may include forming a first adhesive layer 55 on the lower surface of the lower semiconductor chip 60, enabling the first adhesive layer 55 formed on the lower surface of the lower semiconductor chip 60 to contact the protective insulating layer 30 in a position spaced apart from the support patterns 25, and forming the first bonding wire 65 electrically connecting the chip pad 60P of the lower semiconductor chip 60 and the first front pad 20a by performing a wire bonding process.

A first upper semiconductor chip 75 may be mounted to vertically overlap the lower semiconductor chip 60 and the support patterns 25 and electrically connected to the second front pad 20b (S50).

Mounting the first upper semiconductor chip 75 may include forming a second adhesive layer 70 on a lower surface of the first upper semiconductor chip 75, enabling the first adhesive layer 70 formed on the lower surface of the first upper semiconductor chip 75 to contact the portions 30U of the protective insulating layer 30 positioned on the upper surfaces of the support patterns 25 and the upper surface of the lower semiconductor chip 60, and forming a second bonding wire 80 electrically connecting the chip pad 75p of the first upper semiconductor chip 75 and the second front pad 20b by performing a wire bonding process.

One or more second upper semiconductor chips 90a and 90b may be mounted to be electrically connected to the third front pad 20c, on the first upper semiconductor chip 75 (S60).

The one or more second upper semiconductor chips 90a and 90b may be plural. The mounting of the plurality of second upper semiconductor chips 90a and 90b may include forming third adhesive layers 85a and 85b on lower surfaces of the plurality of second upper semiconductor chips 90a and 90b, respectively, sequentially stacking and attaching the plurality of second upper semiconductor chips 90a and 90b to the first upper semiconductor chip 75, using the third adhesive layers 85a and 85b, and forming a third bonding wire 93 electrically connecting the chip pads 90p of the second upper semiconductor chips 90a and 90b and the third front pad 20c by performing a wire bonding process.

Subsequently, an encapsulant (96 in FIG. 2A) may be formed on the package substrate 50. The encapsulant 96 may be on the first upper semiconductor chip 75 and the one or more second upper semiconductor chips 90a and 90b, on the package substrate 50, and may fill spaces between the support patterns 25 and the lower semiconductor chip 60.

As set forth above, according to example embodiments, there is provided a semiconductor package including a package substrate a support pattern on a base and a protective insulating layer on at least an upper surface and a side surface of the support pattern, on the base, a lower semiconductor chip horizontally spaced apart from the support pattern, on the package substrate, and an upper semiconductor chip vertically overlapping the support pattern and the lower semiconductor chip. The support pattern may serve to support the upper semiconductor chip together with the lower semiconductor chip. Accordingly, since the upper semiconductor chip of the semiconductor package may be prevented from being bent or deformed, reliability of the semiconductor package may be improved.

The support pattern may be formed of a metal material such as copper or the like, instead of the dummy semiconductor chip, thereby improving productivity. For example, productivity may be improved by forming the support pattern as a metal post formed of a metal material with easy thickness control.

While example embodiments have been illustrated and described above, it will be apparent to those skilled in the art that modifications and variations could be made without departing from the scope of the present inventive concept as defined by the appended claims.

What is claimed is:

1. A semiconductor package comprising:
a package substrate including a base having a front side and an opposing back side, rear pads below the back side of the base, lower connection portions below the rear pads and in contact with the rear pads, first and second front pads on the front side of the base, a first support portion on the front side of the base having a thickness greater than a thickness of each of the first and second front pads, and a protective insulating layer on an upper surface and a side surface of the first support portion on the front side of the base and having openings exposing the first and second front pads, respectively;
a lower semiconductor chip on the protective insulating layer of the package substrate, spaced apart from the first support portion in a horizontal direction parallel to the front side of the base; and
a first upper semiconductor chip on the package substrate and vertically overlapping the lower semiconductor chip and the first support portion.

2. The semiconductor package of claim 1, further comprising:
a first bonding wire electrically connecting a pad of the lower semiconductor chip and the first front pad; and
a second bonding wire electrically connecting a pad of the first upper semiconductor chip and the second front pad.

3. The semiconductor package of claim 2, further comprising:
a second upper semiconductor chip on the first upper semiconductor chip; and a third bonding wire,
wherein the package substrate further comprises a third front pad on the front side of the base, and
the third bonding wire electrically connects a pad of the second upper semiconductor chip and the third front pad.

4. The semiconductor package of claim 3, further comprising an encapsulant on the first and second upper semiconductor chips, on the package substrate, and contacting a portion of the protective insulating layer and a side surface of the lower semiconductor chip.

5. The semiconductor package of claim 3, wherein the lower semiconductor chip is a controller semiconductor chip,
the first upper semiconductor chip is a DRAM memory semiconductor chip, and
the second upper semiconductor chip is a NAND flash memory semiconductor chip.

6. The semiconductor package of claim 3, wherein a distance between the lower semiconductor chip and the second front pad is greater than a distance between the lower semiconductor chip and the third front pad.

7. The semiconductor package of claim 1, further comprising:
a first adhesive layer in contact with a lower surface of the lower semiconductor chip and the protective insulating layer located below the lower semiconductor chip; and
a second adhesive layer in contact with a lower surface of the first upper semiconductor chip, and an upper surface of the protective insulating layer positioned on an upper surface of the first support portion, and an upper surface of the lower semiconductor chip.

8. The semiconductor package of claim 1, wherein the first support portion includes a copper material.

9. The semiconductor package of claim 1, wherein an upper surface of the protective insulating layer positioned on an upper surface of the first support portion and an upper surface of the lower semiconductor chip are located on substantially a same level.

10. The semiconductor package of claim 1, wherein a thickness of the protective insulating layer located on an upper surface of the first support portion is in a range of about 10 µm to about 20 µm, a thickness of the protective insulating layer located below the lower semiconductor chip is in a range of about 10 µm to about 40 µm, and a thickness of the lower semiconductor chip is in a range of about 70 µm to about 200 µm.

11. The semiconductor package of claim 1, wherein the protective insulating layer comprises a solder resist material or a photo solder resist material.

12. The semiconductor package of claim 1, wherein the package substrate further includes a second support portion spaced apart from the first support portion and having a same thickness as the first support portion,
the protective insulating layer is on an upper surface and a side surface of the second support portion, and
the lower semiconductor chip is between the first support portion and the second support portion.

13. The semiconductor package of claim 12, wherein the package substrate further includes a third support portion and a fourth support portion,
the protective insulating layer is on the upper and side surfaces of each of the third and fourth support portions,
each of the third and fourth support portions has the same thickness as the first support portion,
the first and second support portion are arranged in a first horizontal direction,
the third and fourth support portions are arranged in a second horizontal direction perpendicular to the first horizontal direction, and
the lower semiconductor chip is between the first and second support portions and between the third and fourth support portions.

14. The semiconductor package of claim 1, wherein the base includes base insulating layers, and an interconnection structure penetrating through the base insulating layers and electrically connecting the first and second front pads and the rear pads.

15. The semiconductor package of claim 14, wherein the base further includes a heat dissipation structure connected to the first support portion and electrically connecting the first and second front pads and respective ones of the rear pads.

16. The semiconductor package of claim 14, wherein the first support portion includes a first support layer on the front side of the base formed of a same material and having a same thickness as the first and second front pads, and a second support layer on the first support layer having a thickness greater than a thickness of the first support layer.

17. A semiconductor package comprising:
a package substrate including a base having a front side and an opposite back side, front pads on the front side of the base, a support portion on the front side of the base having a thickness greater than a thickness of each of the front pads, and a protective insulating layer on the front side of the base and having openings exposing the front pads, respectively, and in contact with at least a portion of the support portion;
a lower semiconductor chip on the protective insulating layer and spaced apart from the support portion in a horizontal direction; and a first upper semiconductor chip vertically overlapping the lower semiconductor chip and the support portion, on the protective insulating layer and the lower semiconductor chip, wherein the support portion includes a metal post, and a lower surface of the support portion is below upper surfaces of the front pads.

18. The semiconductor package of claim 17, further comprising a second upper semiconductor chip on the first upper semiconductor chip, wherein the protective insulating layer is in contact with an upper surface and a side surface of the support portion, the first and second upper semiconductor chips are semiconductor chips of different types and different sizes, the first upper semiconductor chip is electrically connected to a first front pad among the front pads by a first bonding wire, the second upper semiconductor chip is electrically connected to a second front pad among the front pads by a second bonding wire, and a distance between the lower semiconductor chip and the first front pad is greater than a distance between the lower semiconductor chip and the second front pad.

19. A package substrate comprising:

a base having a front side and an opposing back side;

rear pads below the back side of the base;

front pads on the front side of the base;

support portions on the front side of the base and having a thickness greater than a thickness of each of the front pads; and a protective insulating layer on an upper surface and a side surface of each of the support portions on the front side of the base and having openings exposing the front pads respectively, wherein the base includes a plurality of base insulating layers and an interconnection structure extending through the plurality of base insulating layers and electrically connecting the front pads and the rear pads.

20. The package substrate of claim 19, wherein the protective insulating layer includes a solder resist material or a photo solder resist material, a thickness of the protective insulating layer positioned on upper surfaces of the support portions is in a range of about 10 μm to about 20 μm, a thickness of the protective insulating layer on the front side of the base in a position spaced apart from the support portions is in a range of about 10 μm to about 40 μm, and the support portions include a copper post.

* * * * *